(12) United States Patent
Park et al.

(10) Patent No.: US 10,192,684 B2
(45) Date of Patent: Jan. 29, 2019

(54) MULTILAYER CAPACITOR AND BOARD HAVING THE SAME MOUNTED THEREON

(71) Applicant: SAMSUNG ELECTRO-MECHANICS CO., LTD., Suwon-si, Gyeonggi-do (KR)

(72) Inventors: Heung Kil Park, Suwon-si (KR); Jong Hwan Park, Suwon-si (KR); Se Hun Park, Suwon-si (KR)

(73) Assignee: SAMSUNG ELECTRO-MECHANICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/644,227

(22) Filed: Jul. 7, 2017

(65) Prior Publication Data

US 2018/0182554 A1 Jun. 28, 2018

(30) Foreign Application Priority Data

Dec. 22, 2016 (KR) .......................... 10-2016-0176314

(51) Int. Cl.
*H01G 4/012* (2006.01)
*H01G 4/248* (2006.01)
(Continued)

(52) U.S. Cl.
CPC .............. *H01G 4/30* (2013.01); *H01G 4/012* (2013.01); *H01G 4/248* (2013.01); *H05K 1/111* (2013.01);
(Continued)

(58) Field of Classification Search
CPC . H01C 1/012; H01C 1/14; H01G 2/06; H01G 4/005; H01G 4/012; H01G 4/248;
(Continued)

(56) References Cited

U.S. PATENT DOCUMENTS 5,339,068 A * 8/1994 Tsunoda ................... H01C 1/02
338/308
9,706,641 B1 * 7/2017 Park .......................... H01G 4/30
(Continued)

FOREIGN PATENT DOCUMENTS

JP 5287934 B2 6/2013
JP 2014-027085 A 2/2014
(Continued)

*Primary Examiner* — Timothy Thompson
*Assistant Examiner* — Guillermo Egoavil
(74) *Attorney, Agent, or Firm* — McDermott Will & Emery LLP

(57) ABSTRACT

A multilayer capacitor includes a capacitor body including dielectric layers and a plurality of first and second internal electrodes exposed through the third and fourth surfaces, and having first to sixth surfaces; first and second external electrodes including first and second connection portions disposed on the third and fourth surfaces, and first and second band portions extending from the first and second connection portions to portions of the first and second surfaces and the fifth and sixth surfaces; first and second conductive resin layers covering portions of the first and second band portions; an insulating layer disposed on the first surface; and first and second terminal electrodes spaced apart from each other, covering portions of the insulating layer, and connected to the first and second external electrodes.

21 Claims, 8 Drawing Sheets

(51) Int. Cl.
    *H01G 4/30*    (2006.01)
    *H05K 1/11*    (2006.01)
    *H05K 1/18*    (2006.01)
    *H01G 4/12*    (2006.01)

(52) U.S. Cl.
    CPC ........... H05K 1/181 (2013.01); *H01G 4/1227* (2013.01); *H05K 2201/10015* (2013.01); *H05K 2201/10636* (2013.01)

(58) Field of Classification Search
    CPC ............ H01G 4/30; H01G 4/40; H01G 4/232; H01G 4/1227; H05K 1/18; H05K 1/111; H05K 1/181; H05K 3/3442; H05K 2201/1053; H05K 2201/10015; H05K 2201/10022; H05K 2201/10515; H05K 2201/10636; Y02P 70/611
    USPC .................. 174/260; 338/306; 361/306.3
    See application file for complete search history.

(56) References Cited

U.S. PATENT DOCUMENTS

| | | | |
|---|---|---|---|
| 2005/0121806 A1* | 6/2005 | Sangiorgi | H05K 3/305 257/787 |
| 2008/0257597 A1* | 10/2008 | Ohsumi | H05K 3/427 174/266 |
| 2010/0044089 A1* | 2/2010 | Shibuya | H01L 23/49822 174/260 |
| 2012/0314338 A1 | 12/2012 | Togashi | |
| 2015/0084487 A1* | 3/2015 | Mori | H01L 41/0472 310/364 |
| 2015/0124370 A1 | 5/2015 | Ahn et al. | |
| 2017/0278638 A1* | 9/2017 | Hattori | H01G 2/06 |
| 2018/0144867 A1* | 5/2018 | Park | H01G 2/06 |

FOREIGN PATENT DOCUMENTS

| | | |
|---|---|---|
| JP | 2014-036149 A | 2/2014 |
| KR | 10-2015-0051667 A | 5/2015 |

* cited by examiner

MULTILAYER CAPACITOR AND BOARD HAVING THE SAME MOUNTED THEREON

CROSS-REFERENCE TO RELATED APPLICATION(S)

This application claims benefit of priority to Korean Patent Application No. 10-2016-0176314 filed on Dec. 22, 2016 in the Korean Intellectual Property Office, the disclosure of which is incorporated herein by reference in its entirety.

TECHNICAL FIELD

The present disclosure relates to a multilayer capacitor and a board having the same mounted thereon.

BACKGROUND

Multilayer ceramic capacitors, multilayer chip electronic components, are chip-type condensers installed on the printed circuit boards of various electronic products, for example, image display devices such as liquid crystal displays (LCDs), plasma display panels (PDPs) or the like, computers, personal digital assistants (PDAs), mobile phones, and the like, to charge or discharge electricity.

Such multilayer ceramic capacitors (MLCCs), having positive attributes such as compactness, guaranteed high capacitance, and ease in the mounting thereof, may be used as components in various electronic devices.

Such an MLCC may have a structure in which a plurality of dielectric layers and internal electrodes are alternately disposed in such a manner that the internal electrodes having different polarities are provided between the dielectric layers.

The dielectric layers have piezoelectric and electrostrictive properties. Thus, when a direct current (DC) or alternating current (AC) voltage is applied to an MLCC, a piezoelectric phenomenon may occur between internal electrodes, thereby causing the occurrence of vibrations.

Vibrations may be transferred to boards on which MLCCs are mounted, through external electrodes of the MLCCs, leading to the entirety of the boards acting as acoustically radiating surfaces to generate vibratory sound as noise.

Vibratory sound may correspond to audio frequencies ranging from 20 Hz to 20,000 Hz, causing listener discomfort, and such a vibratory sound, which may cause listener discomfort, is commonly known as acoustic noise.

As low noise designs of electronic products have come to prominence, acoustic noise generated in MLCCs has become an issue. In particular, reductions of acoustic noise in electronic products having a voice communications function, such as smartphones, have been required.

SUMMARY

An aspect of the present disclosure is to provide a multilayer capacitor in which acoustic noise may be reduced by decreasing piezoelectric vibrations, and a board having the same mounted thereon.

According to an aspect of the present disclosure, a multilayer capacitor includes a capacitor body including dielectric layers and a plurality of first and second internal electrodes alternately disposed therein, having the dielectric layers interposed therebetween, and having a first surface and a second surface opposing each other, a third surface and a fourth surface connected to the first surface and the second surface and opposing each other in one direction, and a fifth surface and a sixth surface connected to the first surface and the second surface, connected to the third surface and the fourth surface, and opposing each other, the plurality of first and second internal electrodes being exposed through at least the third surface and the fourth surface, respectively; a first external electrode and a second external electrode including first and second connection portions disposed on the third surface and the fourth surface of the capacitor body and electrically connected to exposed portions of the plurality of first and second internal electrodes, and first and second band portions extending from the first and second connection portions to portions of the first surface and the second surface of the capacitor body and portions of the fifth surface and the sixth surface of the capacitor body, respectively; a first conductive resin layer and a second conductive resin layer covering portions of the first and second band portions, disposed on the first surface of the capacitor body, respectively; an insulating layer disposed on the first surface of the capacitor body; and a first terminal electrode and a second terminal electrode disposed to be spaced apart from each other in the one direction in which the third surface and the fourth surface of the capacitor body oppose each other, covering portions of the insulating layer disposed on the first surface of the capacitor body, and connected to the first and second external electrodes, respectively.

According to an aspect of the present disclosure, a board having a multilayer capacitor mounted thereon includes a substrate on which first and second electrode pads are spaced apart from each other; and the multilayer capacitor described above, of which first and second terminal electrodes are connected to the first and second electrode pads, respectively, the multilayer capacitor being mounted on the substrate.

BRIEF DESCRIPTION OF DRAWINGS

The above and other aspects, features, and advantages of the present disclosure will be more clearly understood from the following detailed description when taken in conjunction with the accompanying drawings, in which.

DETAILED DESCRIPTION

Figure 1:
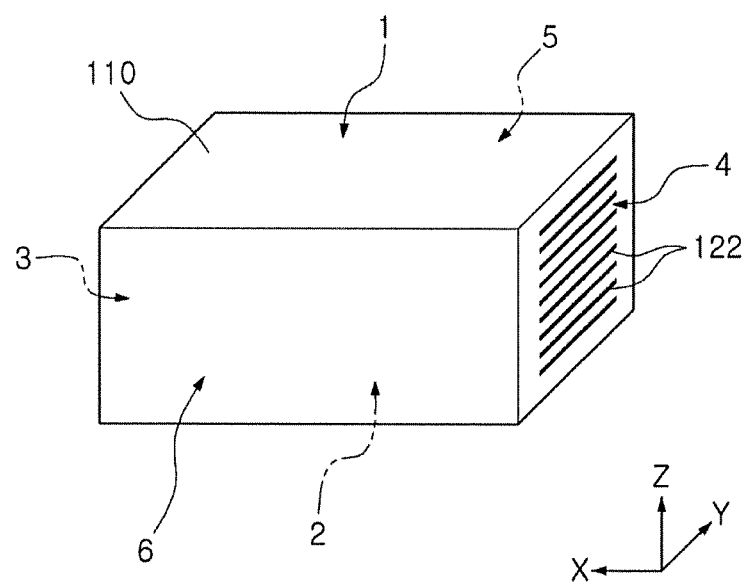
FIG. 1 is a perspective view schematically illustrating a capacitor body of a multilayer capacitor according to a first embodiment in the present disclosure.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be construed as being limited by these terms. These terms are only used to distinguish one member, component, region, layer or section from another region, layer or section. Thus, a first member, component, region, layer or section discussed below could be termed a second member, component, region, layer or section without departing from the teachings of the embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both upward and downward orientations, depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a, " "an, " and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

For example, when the direction of a capacitor body is defined to clearly illustrate exemplary embodiments in the present invention, X, Y and Z illustrated in the drawings represent a length direction, a width direction, and a thickness direction, respectively.

In this exemplary embodiment, for convenience of explanation, two surfaces of a capacitor body 110 of a multilayer capacitor, opposing each other in a Z direction, are set to be first and second surfaces 1 and 2; two surfaces thereof connecting edges of the first surface and the second surface 1 and 2 to each other while opposing each other in an X direction are set to be third and fourth surfaces 3 and 4; and two surfaces thereof, connecting edges of the first surface and the second surface 1 and 2 and edges of the third surface and the fourth surface 3 and 4 to each other, respectively, while opposing each other in a Y direction, are set to be fifth and sixth surfaces 5 and 6, which will be described below. In this case, the first surface 1 may be used as a mounting surface.

Multilayer Capacitor

Figure 2:
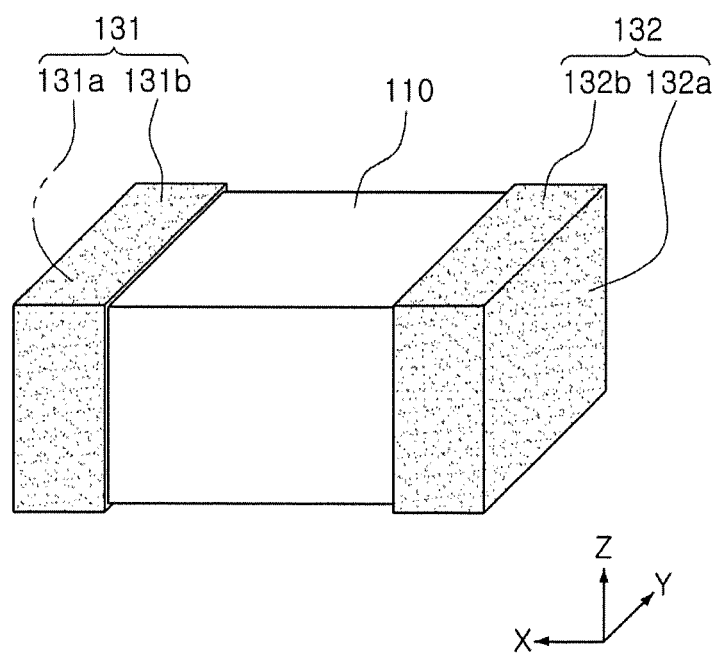
FIG. 2 is a perspective view illustrating that first and second external electrodes are disposed on a capacitor body of a multilayer capacitor according to the first embodiment in the present disclosure.
Figure 3:
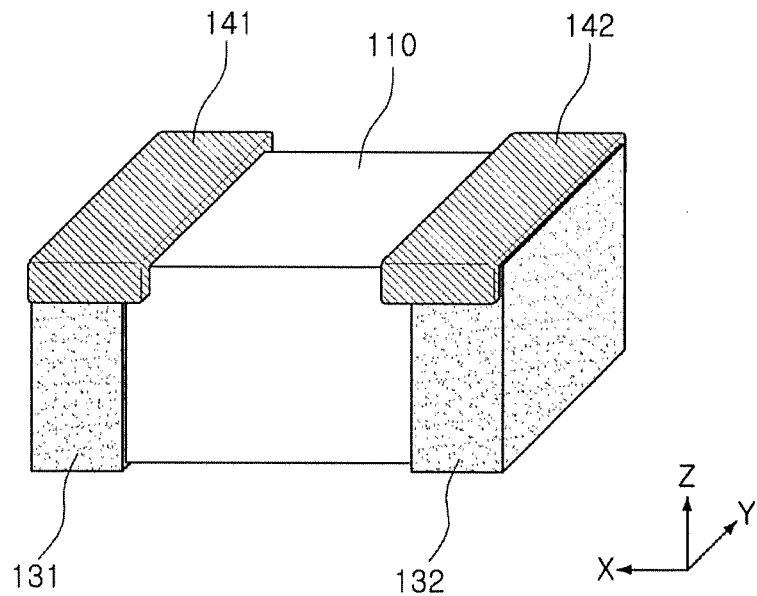
FIG. 3 is a perspective view illustrating that first and second conductive resin layers are added to a structure shown in FIG. 2.
Figure 4:
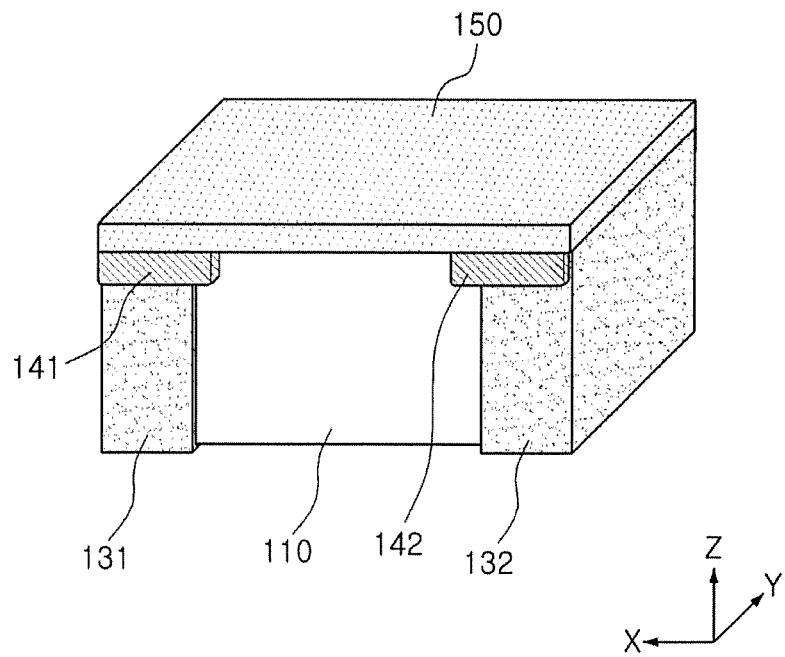
FIG. 4 is a perspective view illustrating that an insulating layer is added to a structure shown in FIG. 3.
Figure 5:
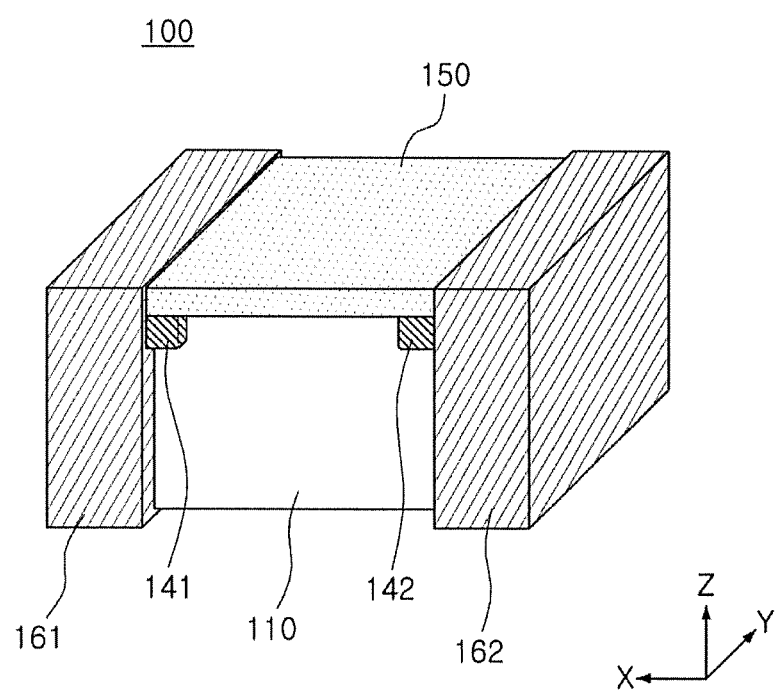
FIG. 5 is a perspective view illustrating that first and second terminal electrodes are added to a structure shown in FIG. 3.
Figure 6:
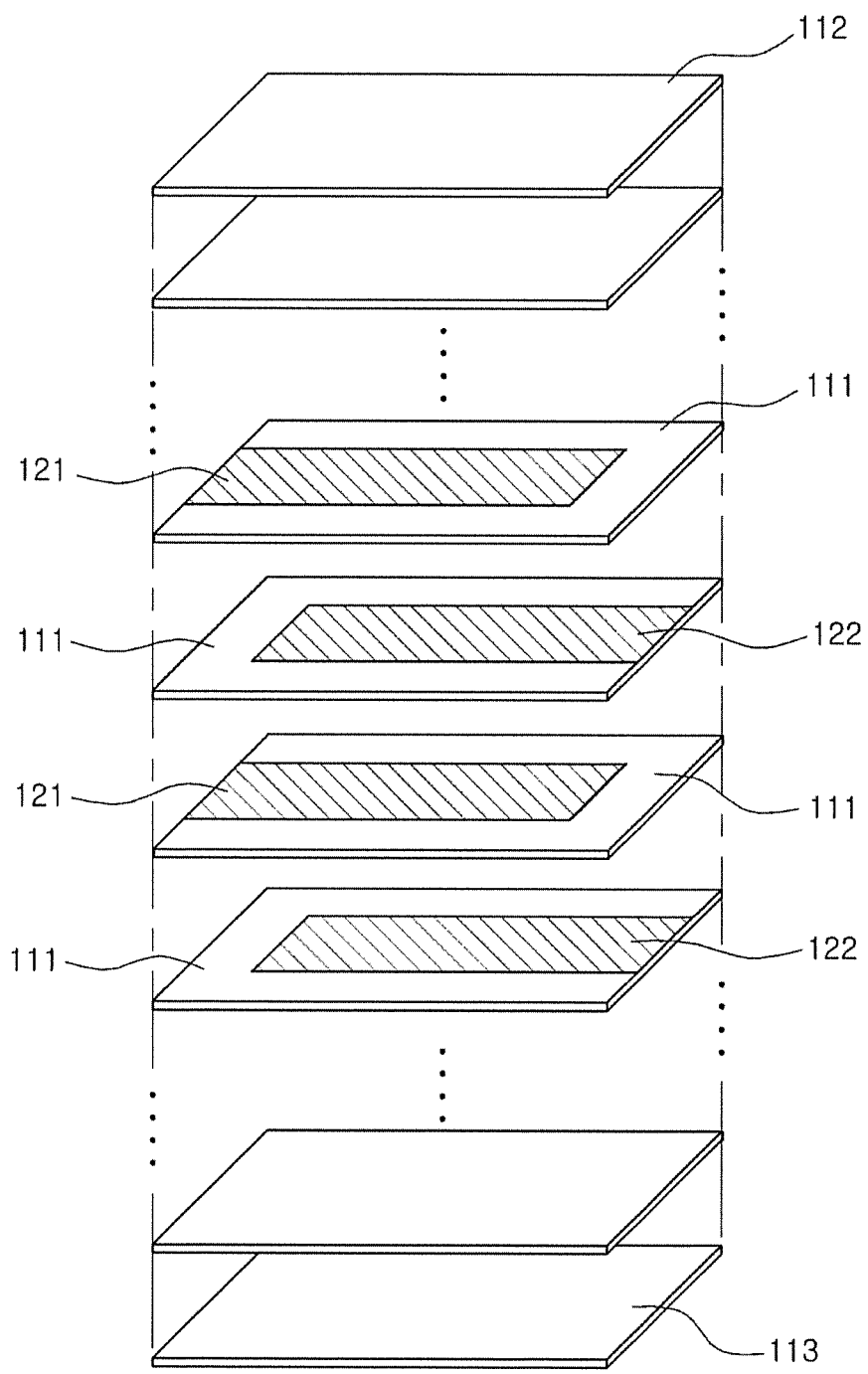
FIG. 6 is a perspective view illustrating first and second internal electrodes in a multilayer capacitor according to the first embodiment in the present disclosure.

FIG. 1 is a perspective view schematically illustrating a capacitor body of a multilayer capacitor according to a first embodiment. FIG. 2 is a perspective view illustrating first and second external electrodes disposed on a capacitor body of a multilayer capacitor according to the first embodiment. FIG. 3 is a perspective view illustrating that first and second conductive resin layers are added to a structure shown in FIG. 2. FIG. 4 is a perspective view illustrating that an insulating layer is added to a structure shown in FIG. 3. FIG. 5 is a perspective view illustrating that first and second terminal electrodes are added to a structure shown in FIG. 3. FIG. 6 is a perspective view illustrating first and second internal electrodes in a multilayer capacitor according to the first embodiment.

With reference to FIGS. 1 to 6, a multilayer capacitor 100 according to a first embodiment may include a capacitor body 110 including a dielectric layer 111 and a plurality of first and second internal electrodes 121 and 122, first and second external electrodes 131 and 132, first and second conductive resin layers 141 and 142, an insulating layer 150, and first and second terminal electrodes 161 and 162.

The capacitor body 110 may be formed by laminating a plurality of dielectric layers 111 in a Z direction, a direction perpendicular to the first surface 1, and although not particularly limited, the capacitor body 110 may have a substantially hexahedral shape as illustrated in the drawings.

In this case, a shape and dimensions of the capacitor body 110 and the number of laminated layers of the dielectric layers 111 are not limited to those illustrated in the drawings.

In addition, the dielectric layer 111 may be in a sintered state. In this case, adjacent dielectric layers 111 may be integrated, such that it may be difficult to confirm boundaries therebetween without using a scanning electron microscope (SEM).

The capacitor body 110 may include an active region including the first and second internal electrodes 121 and 122, serving as a portion contributing to capacitance formation of a capacitor, and cover regions disposed on two sides of the active region as margin portions, respectively, in a Z direction.

The active region may be formed by repeatedly laminating a plurality of the first and second internal electrodes 121 and 122 to have the dielectric layer 111 interposed therebetween.

In this case, a thickness of the dielectric layer 111 may be arbitrarily changed according to a capacitance design of the multilayer capacitor 100.

The dielectric layer 111 may include a ceramic powder having a high dielectric constant, for example, a barium titanate ($BaTiO_3$)-based or strontium titanate ($SrTiO_3$)-based powder, and an exemplary embodiment in the present disclosure is not limited thereto.

In addition, one or more of a ceramic additive, an organic solvent, a plasticizer, a binder and a dispersing agent may be added to the dielectric layer 111 as required, together with the ceramic powder.

The cover regions may be located on outermost portions of the capacitor body 110 in the Z direction, respectively, and may have the same material and configuration as those of the dielectric layer ill, except that the cover regions do not include an internal electrode.

The cover regions may be provided by laminating single dielectric layers 112 and 113, or two or more dielectric layers 112 and 113, on two sides of the active region in the Z direction, respectively. The cover regions may basically serve to prevent the first and second internal electrodes 121 and 122 from being damaged due to physical or chemical impact.

The first and second internal electrodes 121 and 122 may be electrodes having different polarities.

The first and second internal electrodes 121 and 122 may be alternately disposed in the capacitor body 110 in the Z direction, to have the dielectric layer 111 interposed therebetween. An area of an overlap region of the first and second internal electrodes 121 and 122 in the Z direction may be relevant to the capacitance formation of the capacitor.

The first and second internal electrodes 121 and 122 may be formed by printing a conductive paste containing a conductive metal to a predetermined thickness on the dielectric layer 111, and may be electrically insulated by the dielectric layer 111 disposed therebetween.

The conductive metal included in the conductive paste may be, for example, nickel (Ni), copper (Cu), palladium (Pd) or alloys thereof, but an exemplary embodiment in the present disclosure is not limited thereto.

The conductive paste may be printed using a screen printing method, a gravure printing method, or the like, but an exemplary embodiment in the present disclosure is not limited thereto.

One end of the first internal electrode 121 in an X direction may be exposed through the third surface 3 of the capacity body 110, and one end of the second internal electrode 122 in the X direction may be exposed through the fourth surface 4 of the capacity body 110, but a lead-out structure thereof is not limited thereto. For example, the lead-out structure of the internal electrodes may be variously changed.

The first and second external electrodes 131 and 132 may be formed by sintering a coated conductive paste containing a conductive metal and glass.

The conductive metal may be nickel (Ni), copper (Cu), palladium (Pd), gold (Au), or alloys thereof, but an exemplary embodiment in the present disclosure is not limited thereto.

In this case, the first and second external electrodes 131 and 132 may include first and second connection portions 131a and 132a formed on the third and fourth surfaces 3 and 4 of the capacitor body 110 to be connected to exposed ends of the first and second internal electrodes 121 and 122, and first and second band portions 131b and 132b extending from the first and second connection portions 131a and 132a to portions of the first surface and the second surface 1 and 2 of the capacitor body 110 and portions of the fifth and sixth surfaces 5 and 6 of the capacitor body 110, respectively.

The first and second conductive resin layers 141 and 142 may cover the first and second band portions 131b and 132b formed on the first surface 1 of the capacitor body 110, respectively.

In the exemplary embodiment, the first and second conductive resin layers 141 and 142 may respectively extend on the first surface 1 of the capacitor body 110, as well as covering the first and second band portions 131b and 132b formed on the first surface 1 of the capacitor body 110.

In addition, the first and second conductive resin layers 141 and 142 may extend toward the first and second band portions 131b and 132b formed on the fifth and sixth surfaces 5 and 6 of the capacitor body 110 to cover portions thereof and be connected thereto, respectively.

In this case, the first and second conductive resin layers 141 and 142 may respectively be formed to further cover portions of the fifth and sixth surfaces 5 and 6 of the capacitor body 110.

To this end, a width of each of the first and second conductive resin layers 141 and 142 in the X direction may be longer than that of each of the first and second band portions 131b and 132b in the X direction.

The insulating layer 150 may be formed on the first surface 1 of the capacitor body 110 and may cover the first and second band portions 131b and 132b formed on the first surface 1 of the capacitor body 110.

In the exemplary embodiment, the insulating layer 150 may be formed to have the same area as that of the first surface 1 of the capacitor body 110.

In this case, the insulating layer 150 may be formed of a thermosetting resin such as an epoxy, but an exemplary embodiment in the present disclosure is not limited thereto.

For example, when the multilayer capacitor 100 is mounted on a substrate, the insulating layer 150 may absorb mechanical stress caused by deformation, thermal expansion or the like of the substrate to prevent damage to the capacitor body 110, and may also absorb piezoelectric vibrations of the capacitor body 110 to reduce acoustic noise, by elastic force thereof.

In this case, since the insulating layer 150 may further serve to prevent the first and second external electrodes 131 and 132 from being delaminated from the capacitor body 110, a stable acoustic noise reduction effect may be expected in terms of long term stability.

The first and second terminal electrodes 161 and 162 may be formed of a conductive resin including a conductive metal and a resin as fillers. In this case, the resin may be a thermosetting resin.

Thus, the first and second terminal electrodes 161 and 162 may further reduce acoustic noise by additionally suppressing piezoelectric vibrations of the capacitor body 110.

The first and second terminal electrodes 161 and 162 may be disposed to be spaced apart from each other in the X direction, and may cover portions of the insulating layer 150, to be connected to the first and second external electrodes 131 and 132, respectively.

In the exemplary embodiment, the first terminal electrode 161 may be disposed to cover an externally exposed portion of the first external electrode 131 and a portion of the insulating layer 150 formed on the first surface 1 of the capacitor body 110.

In this case, a portion of the first conductive resin layer 141 may be externally exposed without being covered by the first terminal electrode 161.

The second terminal electrode 162 may be disposed to cover an externally exposed portion of the second external electrode 132 and a portion of the insulating layer 150 formed on the first surface 1 of the capacitor body 110.

In this case, a portion of the second conductive resin layer 142 may be externally exposed without being covered by the second terminal electrode 162.

On the other hand, a multilayer capacitor may be deformed due to a difference in thermal expansion coefficients between the capacitor body 110, the insulating layer 150, and the first and second terminal electrodes 161 and 162 to cause a reduction in adhesion force between the capacitor body 110 and the insulating layer 150 by which delamination therebetween may occur.

However, in the case of an exemplary embodiment in the present disclosure, the conductive resin layers 141 and 142 may be formed between the capacitor body 110 and the insulating layer 150 to relieve strain stress, thereby preventing the insulating layer 150 from being delaminated to obtain a stable acoustic noise reduction effect.

Figure 7:
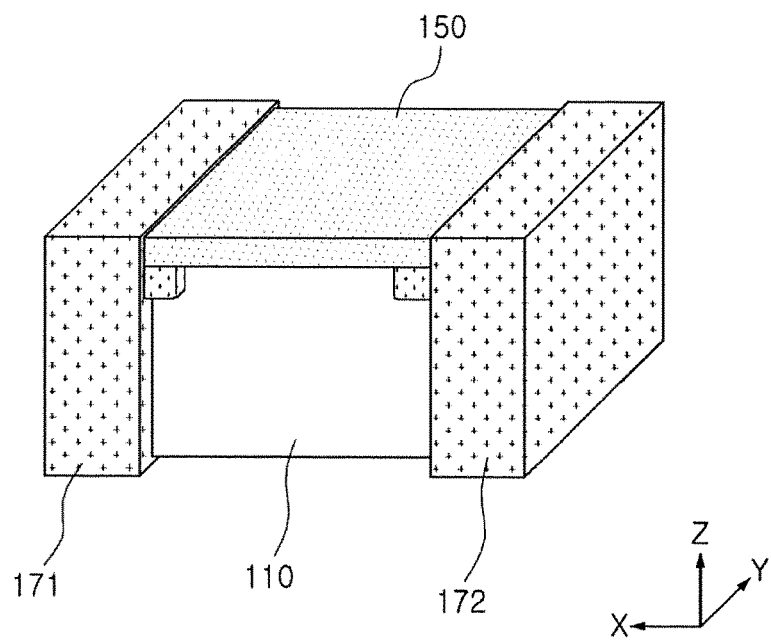
FIG. 7 is a perspective view illustrating that a plating layer is added to a structure shown in FIG. 5.

As illustrated in FIG. 7, the multilayer capacitor 100 according to the exemplary embodiment may further include plating layers 171 and 172 formed on the first and second terminal electrodes 161 and 162, respectively.

The plating layers 171 and 172 may have a structure in which a nickel (Ni) plating layer and a tin (Sn) plating layer are sequentially laminated.

Variation Example

Figure 8:
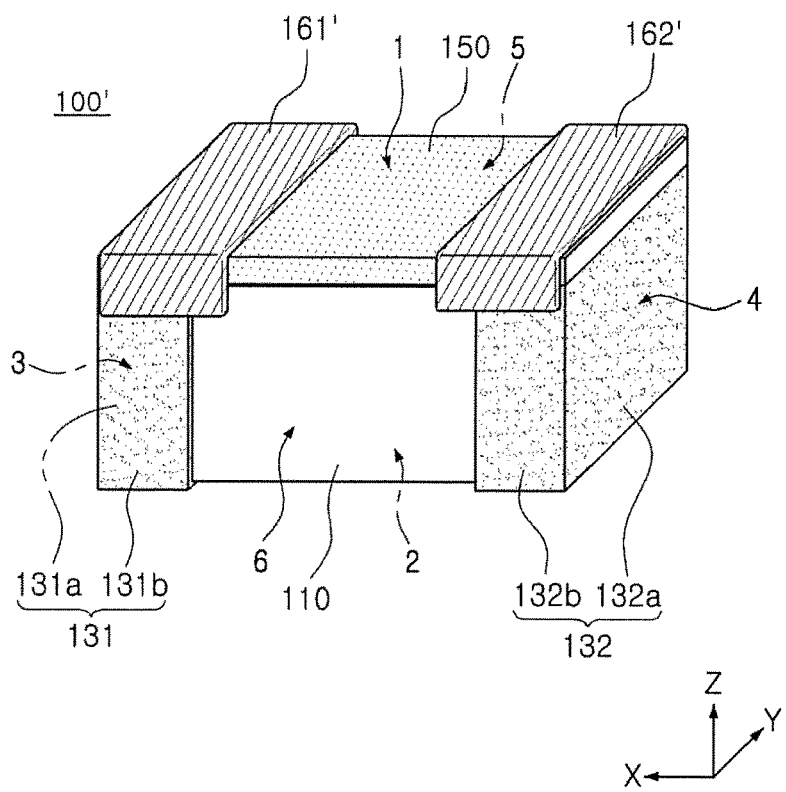
FIG. 8 is a perspective view illustrating another example of first and second external electrodes disposed on a capacitor body of a multilayer capacitor according to an exemplary embodiment in the present disclosure.

FIG. 8 is a perspective view illustrating another example of the first and second terminal electrodes disposed on a capacitor body of a multilayer capacitor according to an exemplary embodiment.

In this case, since the structures of a dielectric layer 111, first and second internal electrodes 121 and 122, a capacitor body 110, first and second external electrodes 131 and 132, first and second conductive resin layers 141 and 142, and an insulating layer 150 are similar to those in the foregoing exemplary embodiment, detailed descriptions thereof will be omitted to avoid overlapped descriptions.

Referring to FIG. 8, first and second terminal electrodes 161' and 162' of a multilayer capacitor 100' in the exemplary embodiment may extend in a Z direction from an edge of the insulating layer 150, to be connected to first and second band portions 131b and 132b formed on fifth and sixth surfaces 5 and 6 of a capacitor body 110, respectively.

In addition, portions of the extended portions of the first and second terminal electrodes 161' and 162' may be disposed on portions of the fifth and sixth surfaces 5 and 6 of the capacitor body 110, respectively.

In this case, the first and second terminal electrodes 161' and 162' may not be formed on portions of the insulating layer 150 corresponding to the third surface 3 and the fourth surface 4.

Thus, since a solder fillet is not formed on two sides of the multilayer capacitor in the X direction when the multilayer capacitor is mounted on a substrate, a mounting area thereof may be reduced.

In addition, as the volume of solder fillet is reduced as described above, piezoelectric vibrations transferred from the solder fillet to the substrate may also be reduced, and thus, an acoustic noise reduction effect may further be improved.

Figure 9:
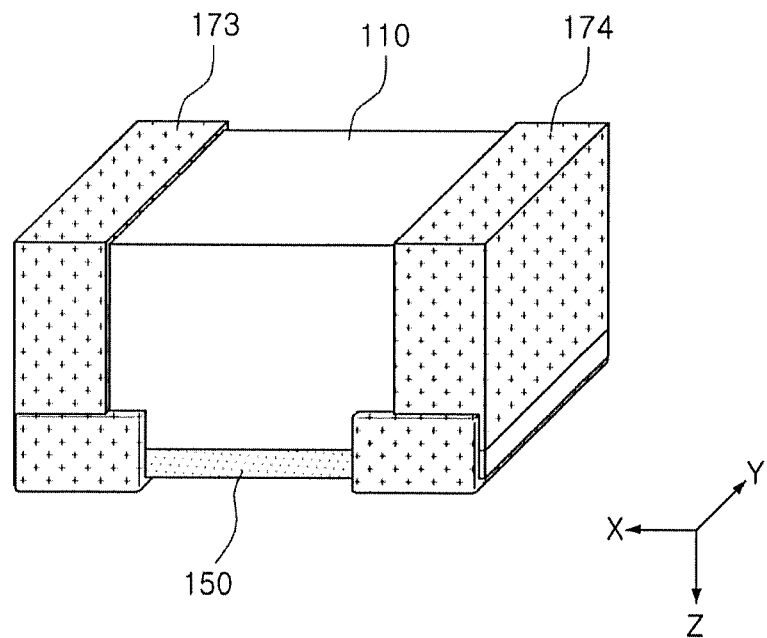
FIG. 9 is a perspective view illustrating that a plating layer is added to a structure shown in FIG. 8.

Further, with reference to FIG. 9, the multilayer capacitor 100' according to the exemplary embodiment may further include plating layers 173 and 174 formed on the first and second terminal electrodes 161' and 162', respectively, and on the first and second external electrodes 131 and 132, respectively.

In this case, the plating layers 173 and 174 may have a structure in which a nickel (Ni) plating layer and a tin (Sn) plating layer are sequentially laminated.

Board having Multilayer Capacitor Mounted Thereon

Figure 10:
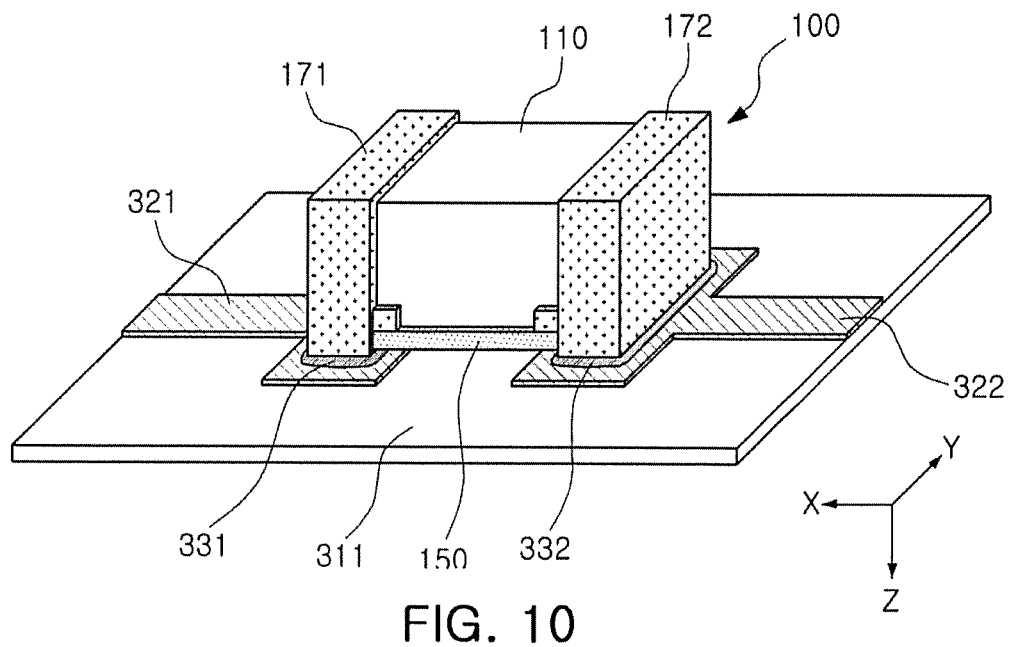
FIG. 10 is a perspective view schematically illustrating a state in which a multilayer capacitor of FIG. 7 is mounted on a substrate.

With reference to FIG. 10, according to an exemplary embodiment, a board having a multilayer capacitor mounted thereon may include a substrate 311 on which a multilayer capacitor 100 according to the first embodiment is mounted, and first and second electrode pads 321 and 322 spaced apart from each other in an X direction on the substrate 311.

In the case of the multilayer capacitor 100, plating layers 171 and 172 formed on first and second terminal electrodes 161 and 162 may be fixed to the first and second electrode pads 321 and 322 by solders 331 and 332 in a state in which the plating layers 171 and 172 formed on the first and second terminal electrodes 161 and 162 are in contact with the first and second electrode pads 321 and 322, respectively, and thus, the multilayer capacitor 100 may be electrically connected to the substrate 311.

Figure 11:
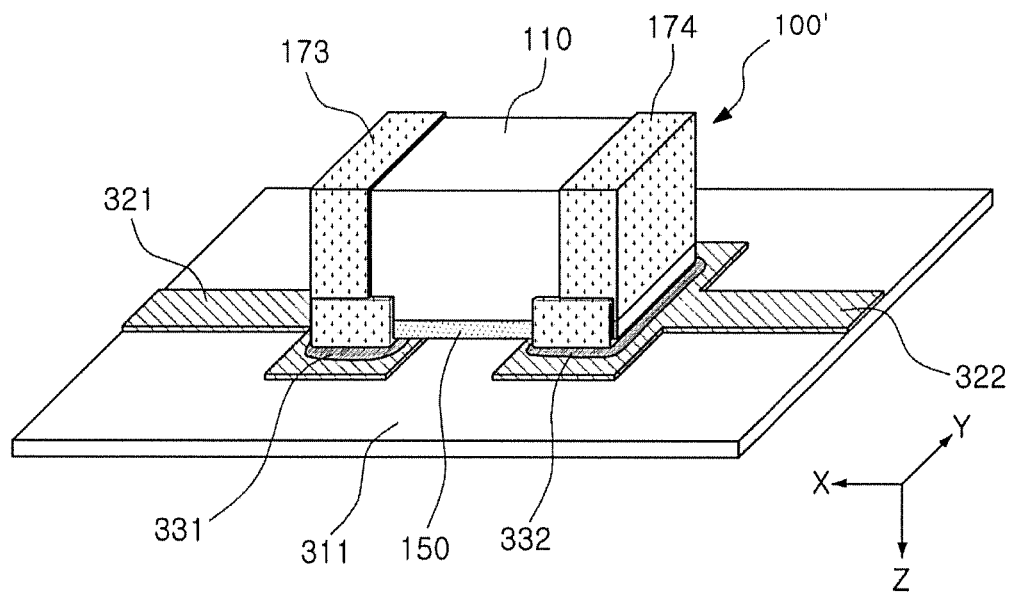
FIG. 11 is a perspective view schematically illustrating a state in which a multilayer capacitor of FIG. 9 is mounted on a substrate.

With reference to FIG. 11, according to a second embodiment, a board having a multilayer capacitor mounted thereon may include a substrate 311 on which a multilayer capacitor 100' according to the first embodiment is mounted, and first and second electrode pads 321 and 322 spaced apart from each other in an X direction on the substrate 311.

In the case of the multilayer capacitor 100', plating layers 173 and 174 formed on first and second terminal electrodes 161' and 162' and first and second external electrodes 131 and 132 may be fixed to the first and second electrode pads 321 and 322 by solders 331 and 332 in a state in which the plating layers 173 and 174 formed on the first and second terminal electrodes 161' and 162' and the first and second external electrodes 131 and 132 are in contact therewith, respectively, and thus, the multilayer capacitor 100' may be electrically connected to the substrate 311.

Figure 12:
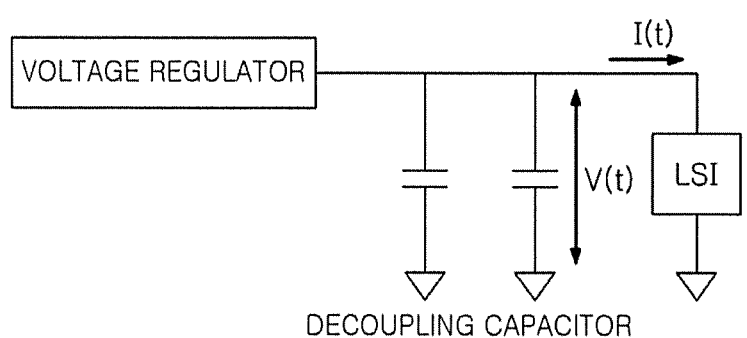
FIG. 12 is a circuit diagram schematically illustrating an exemplary embodiment of the present disclosure in which a multilayer capacitor of the first embodiment in the present disclosure is used as a decoupling capacitor of a power supply circuit of a large scale integration (LSI)
Figure 13:
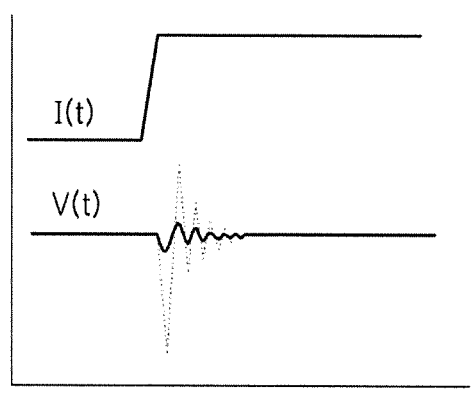
FIG. 13 is a graph illustrating a change in current and a change in voltage in the power supply circuit of FIG. 12.

FIG. 12 is a schematic circuit diagram illustrating an exemplary embodiment of the present disclosure in which a multilayer capacitor is used as a decoupling capacitor of a power supply circuit of an LSI. FIG. 13 is a graph illustrating a change (I(t)) in current and a change (V(t)) in voltage in the power supply circuit of FIG. 12.

With reference to FIGS. 12 and 13, a plurality of decoupling capacitors disposed between a voltage regulator and the LSI may absorb a sudden and large change in current flowing in the LSI and a voltage variation caused by wiring inductance, thereby stabilizing a voltage.

In this case, a possibility that antiresonance may occur between capacitors and impedance may be increased may be present.

However, for example, when a multilayer capacitor according to the exemplary embodiment is used as a decoupling capacitor used in an LSI power supply circuit, a current path may be reduced by a terminal electrode formed on a mounting surface of a capacitor body, and thus, ESL may be reduced.

Thus, the current change, and voltage variation caused by wiring inductance, may be absorbed, thereby significantly reducing power impedance.

In addition, the stability of a system against LSI power noise may be significantly improved.

As set forth above, according to an exemplary embodiment, piezoelectric vibrations may be absorbed by elastic force of an insulating layer, and thus, acoustic noise may be reduced.

While exemplary embodiments have been shown and described above, it will be apparent to those skilled in the art that modifications and variations could be made without departing from the scope of the present invention as defined by the appended claims.

What is claimed is:

1. A multilayer capacitor comprising:
   a capacitor body including dielectric layers and a plurality of first and second internal electrodes alternately disposed therein, having the dielectric layers interposed therebetween, and having a first surface and a second surface opposing each other in a first direction, a third surface and a fourth surface connected to the first surface and the second surface and opposing each other in a second direction, and a fifth surface and a sixth surface connected to the first surface and the second surface, connected to the third surface and the fourth surface, and opposing each other in a third direction, the plurality of first and second internal electrodes being exposed through at least the third surface and the fourth surface, respectively;
   a first external electrode and a second external electrode including first and second connection portions disposed on the third surface and the fourth surface of the capacitor body and electrically connected to exposed portions of the plurality of first and second internal electrodes, and first and second band portions extending from the first and second connection portions to portions of the first surface and the second surface of the capacitor body and to portions of the fifth surface and the sixth surface of the capacitor body, respectively;
   a first conductive resin layer including a first portion covering a portion of the first band portion and disposed on the first surface of the capacitor body, and a second portion extending from the first surface onto one of the surfaces of the capacitor body other than the first surface;
   a second conductive resin layer including a third portion covering a portion of the second band portion and disposed on the first surface of the capacitor body, and a fourth portion extending from the first surface onto one of the surfaces of the capacitor body other than the first surface;
   an insulating layer disposed on the first surface of the capacitor body; and
   a first terminal electrode and a second terminal electrode disposed to be spaced apart from each other in the second direction, covering portions of the insulating layer disposed on the first surface of the capacitor body, and connected to the first and second external electrodes, respectively.

2. The multilayer capacitor of claim 1, wherein the first and second terminal electrodes cover portions of the first and second external electrodes, respectively.

3. A multilayer capacitor comprising:
   a capacitor body including dielectric layers and a plurality of first and second internal electrodes alternately disposed therein, having the dielectric layers interposed therebetween, and having a first surface and a second surface opposing each other in a first direction, a third surface and a fourth surface connected to the first surface and the second surface and opposing each other in a second direction, and a fifth surface and a sixth surface connected to the first surface and the second surface, connected to the third surface and the fourth surface, and opposing each other in a third direction, the plurality of first and second internal electrodes being exposed through at least the third surface and the fourth surface, respectively;
   a first external electrode and a second external electrode including first and second connection portions disposed on the third surface and the fourth surface of the capacitor body and electrically connected to exposed portions of the plurality of first and second internal electrodes, and first and second band portions extending from the first and second connection portions to portions of the first surface and the second surface of the capacitor body and to portions of the fifth surface and the sixth surface of the capacitor body, respectively;
   a first conductive resin layer and a second conductive resin layer respectively covering portions of the first and second band portions, and disposed on the first surface of the capacitor body;
   an insulating layer disposed on the first surface of the capacitor body;
   a first terminal electrode and a second terminal electrode disposed to be spaced apart from each other in the second direction, covering portions of the insulating layer disposed on the first surface of the capacitor body, and connected to the first and second external electrodes, respectively,
   wherein the first and second terminal electrodes extend in a direction from an edge of the insulating layer to the fifth surface and the sixth surface of the capacitor body, respectively.

4. The multilayer capacitor of claim 1, wherein the first and second conductive resin layers extend to portions of the first surface of the capacitor body.

5. A multilayer capacitor comprising:
   a capacitor body including dielectric layers and a plurality of first and second internal electrodes alternately disposed therein, having the dielectric layers interposed therebetween, and having a first surface and a second surface opposing each other in a first direction, a third surface and a fourth surface connected to the first surface and the second surface and opposing each other in a second direction, and a fifth surface and a sixth surface connected to the first surface and the second surface, connected to the third surface and the fourth surface, and opposing each other in a third direction, the plurality of first and second internal electrodes being exposed through at least the third surface and the fourth surface, respectively;

a first external electrode and a second external electrode including first and second connection portions disposed on the third surface and the fourth surface of the capacitor body and electrically connected to exposed portions of the plurality of first and second internal electrodes, and first and second band portions extending from the first and second connection portions to portions of the first surface and the second surface of the capacitor body and to portions of the fifth surface and the sixth surface of the capacitor body, respectively;

a first conductive resin layer and a second conductive resin layer respectively covering portions of the first and second band portions, and disposed on the first surface of the capacitor body;

an insulating layer disposed on the first surface of the capacitor body;

a first terminal electrode and a second terminal electrode disposed to be spaced apart from each other in the second direction, covering portions of the insulating layer disposed on the first surface of the capacitor body, and connected to the first and second external electrodes, respectively, wherein the first and second conductive resin layers extend in a direction from the first and second band portions disposed on the first surface of the capacitor body to the fifth surface and the sixth surface of the capacitor body, respectively.

6. The multilayer capacitor of claim 1, further comprising plating layers disposed on the first and second terminal electrodes.

7. The multilayer capacitor of claim 1, wherein the dielectric layers and the plurality of first and second internal electrodes are laminated in a direction perpendicular to a mounting surface.

8. The multilayer capacitor of claim 1, wherein the first surface of the capacitor body is a mounting surface.

9. The multilayer capacitor of claim 1, wherein the first and second terminal electrodes are not disposed on the third surface and the fourth surface.

10. A board having a multilayer capacitor mounted thereon, comprising:
a substrate on which first and second electrode pads are spaced apart from each other; and
the multilayer capacitor of claim 1, of which the first and second terminal electrodes are connected to the first and second electrode pads, respectively, the multilayer capacitor being mounted on the substrate.

11. The multilayer capacitor of claim 2, wherein the portions of the first and second external electrodes respectively covered by the first and second terminal electrodes are not disposed on the first surface.

12. The multilayer capacitor of claim 2, wherein the portions of the first and second external electrodes respectively covered by the first and second terminal electrodes are in direct contact with the first and second terminal electrodes.

13. A multilayer capacitor comprising:
a capacitor body including dielectric layers and a plurality of first and second internal electrodes alternately disposed therein, having the dielectric layers interposed therebetween, and having a first surface and a second surface opposing each other in a first direction, a third surface and a fourth surface connected to the first surface and the second surface and opposing each other in a second direction, and a fifth surface and a sixth surface connected to the first surface and the second surface, connected to the third surface and the fourth surface, and opposing each other in a third direction, the plurality of first and second internal electrodes being exposed through at least the third surface and the fourth surface, respectively;

a first external electrode and a second external electrode including first and second connection portions disposed on the third surface and the fourth surface of the capacitor body and electrically connected to exposed portions of the plurality of first and second internal electrodes, and first and second band portions extending from the first and second connection portions to portions of the first surface and the second surface of the capacitor body and to portions of the fifth surface and the sixth surface of the capacitor body, respectively;

a first conductive resin layer and a second conductive resin layer respectively covering portions of the first and second band portions, and disposed on the first surface of the capacitor body;

an insulating layer disposed on the first surface of the capacitor body; and a first terminal electrode and a second terminal electrode disposed to be spaced apart from each other in the second direction and connected to the first and second external electrodes, respectively, wherein the first terminal electrode includes a first portion covering one portion of the insulating layer disposed on the first surface of the capacitor body, and a second portion extending from the first portion onto one or more of the third surface, the fifth surface, or the sixth surface of the capacitor body, and the second terminal electrode includes a third portion covering another portion of the insulating layer disposed on the first surface of the capacitor body, and a fourth portion extending from the third portion onto one or more of the fourth surface, the fifth surface, or the sixth surface of the capacitor body.

14. The multilayer capacitor of claim 13, wherein the first and second terminal electrodes extend to cover portions of the first and second external electrodes, respectively.

15. The multilayer capacitor of claim 14, wherein the portions of the first and second external electrodes respectively covered by the first and second terminal electrodes are not disposed on the first surface.

16. The multilayer capacitor of claim 14, wherein the portions of the first and second external electrodes respectively covered by the first and second terminal electrodes are in direct contact with the first and second terminal electrodes.

17. The multilayer capacitor of claim 13, wherein the first and second conductive resin layers extend to portions of the first surface of the capacitor body.

18. The multilayer capacitor of claim 13, further comprising plating layers disposed on the first and second terminal electrodes.

19. The multilayer capacitor of claim 13, wherein the dielectric layers and the plurality of first and second internal electrodes are laminated in the first direction.

20. The multilayer capacitor of claim 13, wherein the first and second terminal electrodes are not disposed on the third surface and the fourth surface.

21. A multilayer capacitor comprising:
a capacitor body including dielectric layers and a plurality of first and second internal electrodes alternately disposed therein, having the dielectric layers interposed therebetween, and having a first surface and a second surface opposing each other in a first direction, a third surface and a fourth surface connected to the first surface and the second surface and opposing each other in a second direction, and a fifth surface and a sixth surface connected to the first surface and the second surface, connected to the third surface and the fourth surface, and opposing each other in a third direction, the plurality of first and second internal electrodes being exposed through at least the third surface and the fourth surface, respectively;

a first external electrode and a second external electrode including first and second connection portions disposed on the third surface and the fourth surface of the capacitor body and electrically connected to exposed portions of the plurality of first and second internal electrodes, and first and second band portions extending from the first and second connection portions to portions of the first surface and the second surface of the capacitor body and to portions of the fifth surface and the sixth surface of the capacitor body, respectively;

a first conductive resin layer and a second conductive resin layer respectively covering portions of the first and second band portions, and disposed on the first surface of the capacitor body; and an insulating layer disposed on the first surface of the capacitor body, wherein the first conductive resin layer and the second conductive resin layer are disposed on an upper surface of the insulating layer, and the multilayer capacitor has only two electrodes disposed on a lower surface of the insulating layer opposing the upper surface of the insulating layer, one of the two electrodes electrically connected to the first external electrode and another of the two electrodes electrically connected to the second external electrode.

* * * * *